United States Patent
Marck et al.

(10) Patent No.: US 11,456,369 B2
(45) Date of Patent: *Sep. 27, 2022

(54) REALTIME WIRELESS SYNCHRONIZATION OF LIVE EVENT AUDIO STREAM WITH A VIDEO RECORDING

(71) Applicant: BYGGE TECHNOLOGIES INC., Bainbridge Island, WA (US)

(72) Inventors: Neil C. Marck, Bainbridge Island, WA (US); Anthony Sharick, Bainbridge Island, WA (US)

(73) Assignee: BYGGE TECHNOLOGIES INC., Bainbridge Island, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/538,605

(22) Filed: Aug. 12, 2019

(65) Prior Publication Data

US 2019/0363171 A1 Nov. 28, 2019

Related U.S. Application Data

(63) Continuation of application No. 15/887,784, filed on Feb. 2, 2018, now Pat. No. 10,644,122, which is a (Continued)

(51) Int. Cl.
*G11B 27/00* (2006.01)
*H04N 9/88* (2006.01)
(Continued)

(52) U.S. Cl.
CPC ............ *H01L 29/45* (2013.01); *C23C 14/185* (2013.01); *G06F 16/00* (2019.01); *G11B 27/036* (2013.01);
(Continued)

(58) Field of Classification Search
CPC ............ G11B 27/00; H04N 9/88; H04N 5/94
(Continued)

(56) References Cited

U.S. PATENT DOCUMENTS 6,614,729 B2 9/2003 Griner et al.
7,707,224 B2 4/2010 Chastagnol et al.
(Continued)

FOREIGN PATENT DOCUMENTS

CN 103999453 A 8/2014
EP 2658209 A2 10/2013
(Continued)

*Primary Examiner* — Daquan Zhao
(74) *Attorney, Agent, or Firm* — FisherBroyles, LLP; Jeremy P. Sanders

(57) ABSTRACT

Systems and methods are presented herein that facilitate temporally synchronizing, in real time, a separately sourced high quality audio segment of a live event with a video segment that is generated by a recording device associated with a member of the audience. An A-V Synchronization Application may synchronize a video segment of a live event that is generated from a personal electronic device of an audience member with a high quality audio segment that is separately sourced and generated by professional sound recording equipment at the live event. The result of the temporal synchronization is a high fidelity digital audio visual recording of the live event. In various, the audience member may stream, in real-time, the high fidelity digital audio visual recording to an additional electronic device at a different geo-location. In some examples, narrative audio segments may be also included as part of the high fidelity digital audio visual recording.

13 Claims, 7 Drawing Sheets

Related U.S. Application Data continuation of application No. 14/960,192, filed on Dec. 4, 2015, now Pat. No. 9,888,296, which is a continuation-in-part of application No. 14/671,381, filed on Mar. 27, 2015, now abandoned.

(51) Int. Cl.

| | | |
|---|---|---|
| *H04N 5/93* | (2006.01) | |
| *H01L 29/45* | (2006.01) | |
| *H04N 21/81* | (2011.01) | |
| *H04N 21/2187* | (2011.01) | |
| *H04N 21/4147* | (2011.01) | |
| *H04N 5/76* | (2006.01) | |
| *H04N 7/56* | (2006.01) | |
| *H04N 21/2343* | (2011.01) | |
| *H04N 21/2368* | (2011.01) | |
| *H04N 21/485* | (2011.01) | |
| *H04N 7/16* | (2011.01) | |
| *H04N 21/643* | (2011.01) | |
| *H04N 21/6334* | (2011.01) | |
| *H04N 7/167* | (2011.01) | |
| *H04N 21/4545* | (2011.01) | |
| *H04N 21/475* | (2011.01) | |
| *H04N 21/4415* | (2011.01) | |
| *H04N 21/845* | (2011.01) | |
| *H04N 21/858* | (2011.01) | |
| *H04N 21/41* | (2011.01) | |
| *G06F 16/00* | (2019.01) | |
| *G11B 27/036* | (2006.01) | |
| *G11B 27/10* | (2006.01) | |
| *H04N 21/43* | (2011.01) | |
| *C23C 14/18* | (2006.01) | |
| *H01L 21/04* | (2006.01) | |
| *H01L 29/16* | (2006.01) | |
| *H04N 5/94* | (2006.01) | |

(52) U.S. Cl.
CPC .......... *G11B 27/10* (2013.01); *H01L 21/0485* (2013.01); *H01L 29/1608* (2013.01); *H04N 5/76* (2013.01); *H04N 7/162* (2013.01); *H04N 7/1675* (2013.01); *H04N 7/56* (2013.01); *H04N 21/2187* (2013.01); *H04N 21/2368* (2013.01); *H04N 21/23439* (2013.01); *H04N 21/4135* (2013.01); *H04N 21/4147* (2013.01); *H04N 21/43072* (2020.08); *H04N 21/4415* (2013.01); *H04N 21/45457* (2013.01); *H04N 21/4753* (2013.01); *H04N 21/4852* (2013.01); *H04N 21/6334* (2013.01); *H04N 21/64322* (2013.01); *H04N 21/8106* (2013.01); *H04N 21/8456* (2013.01); *H04N 21/8586* (2013.01)

(58) Field of Classification Search
USPC ................ 386/285, 278, 280, 282, 291, 239
See application file for complete search history.

(56) References Cited

U.S. PATENT DOCUMENTS

| | | | |
|---|---|---|---|
| 8,064,747 B2 | 11/2011 | Amano et al. | |
| 8,103,511 B2 | 1/2012 | Basson et al. | |
| 9,298,407 B2* | 3/2016 | Chang | H04L 63/0428 |
| 9,324,064 B2 | 4/2016 | Rivera et al. | |
| 9,485,307 B1* | 11/2016 | Siegel | H04L 65/601 |
| 9,888,296 B2 | 2/2018 | Marck et al. | |
| 2003/0164924 A1 | 9/2003 | Sherman et al. | |
| 2008/0145032 A1 | 6/2008 | Lindroos et al. | |
| 2008/0239879 A1 | 10/2008 | Someya | |
| 2008/0320545 A1 | 12/2008 | Schwartz | |
| 2009/0040289 A1* | 2/2009 | Hetherington | G06F 3/04883 348/14.12 |
| 2009/0172763 A1* | 7/2009 | Liu | H04N 21/8106 725/114 |
| 2009/0207277 A1* | 8/2009 | Kurihara | H04N 5/772 348/231.4 |
| 2011/0088068 A1* | 4/2011 | Patnoe | H04L 65/608 725/61 |
| 2011/0093101 A1* | 4/2011 | Casagrande | G06F 16/635 700/94 |
| 2011/0250819 A1* | 10/2011 | Tashman | A63H 33/18 446/46 |
| 2013/0070093 A1 | 3/2013 | Rivera et al. | |
| 2013/0259262 A1 | 10/2013 | Ohtsuka | |
| 2013/0259446 A1 | 10/2013 | Sathish | |
| 2013/0286153 A1 | 10/2013 | Williams, IV et al. | |
| 2013/0291035 A1 | 10/2013 | Jarvis | |
| 2014/0137162 A1 | 5/2014 | McNamee et al. | |
| 2014/0355947 A1 | 12/2014 | Slamecka et al. | |
| 2015/0139616 A1 | 5/2015 | Lindroos et al. | |
| 2015/0279424 A1 | 10/2015 | Marck et al. | |
| 2016/0286282 A1 | 9/2016 | Marck | |

FOREIGN PATENT DOCUMENTS

| | | |
|---|---|---|
| GB | 2505978 A | 3/2014 |
| WO | 2013040603 A2 | 3/2013 |

* cited by examiner

REALTIME WIRELESS SYNCHRONIZATION OF LIVE EVENT AUDIO STREAM WITH A VIDEO RECORDING

CROSS REFERENCE TO RELATED APPLICATION

This patent application is a continuation of and claims priority to and co-owned U.S. patent application Ser. No. 15/887,784, filed Feb. 2, 2018, which is a continuation of U.S. patent application Ser. No. 14/960,192. filed Dec. 4, 2015, entitled "REAL-TIME WIRELESS SYNCHRONIZATION OF LIVE EVENT AUDIO STREAM WITH A VIDEO RECORDING," issued as U.S. Pat. No. 9,888,296, which is a continuation-in-part of and claims priority to commonly owned U.S. patent application Ser. No. 14/671,381 filed on Mar. 27, 2015, now abandoned, entitled "SOUND QUALITY OF THE AUDIO PORTION OF AUDIONIDEO FILES RECORDED DURING A LIVE EVENT," which are herein incorporated by reference in their entirety.

BACKGROUND

Handheld audio-visual (AV) recording devices are often used to generate AV recordings of different types of events, such as birthdays, celebrations, as well as live events of artistic or oratory performances. Typically, a handheld AV recording device is equipped with integrated microphones that are capable of converting sound energy waves into low fidelity audio signals. Generally, low fidelity audio signals can adequately characterize the audio of personal events, such as birthdays and celebrations. However, a low fidelity audio signal can lack sufficient sound quality to clearly capture the sound of a live event, thereby detracting listeners from an appreciation of the artistic or oratory performance. Many factors may contribute to a low sound quality. For example, integrated microphones are inherently limited and incapable of converting sound energy waves into high fidelity audio signals. Further, an audio recording may be affected by background noise from other audience members at the live event or other ambient noise. Moreover, the handheld AV recording device may itself be positioned too far away from the performance. Therefore, a need exists to allow audience members of a live event to incorporate a high-fidelity audio signal of the live event into a video segment that records their personal experiences via a handheld AV recording device.

BRIEF DESCRIPTION OF THE DRAWINGS

The detailed description is described with reference to accompanying figures. In the figures, the left-most digit(s) of the reference number identifies the figure in which the reference number first appears. The same reference number in different figures indicates similar or identical items.

DETAILED DESCRIPTION

Figure 1:
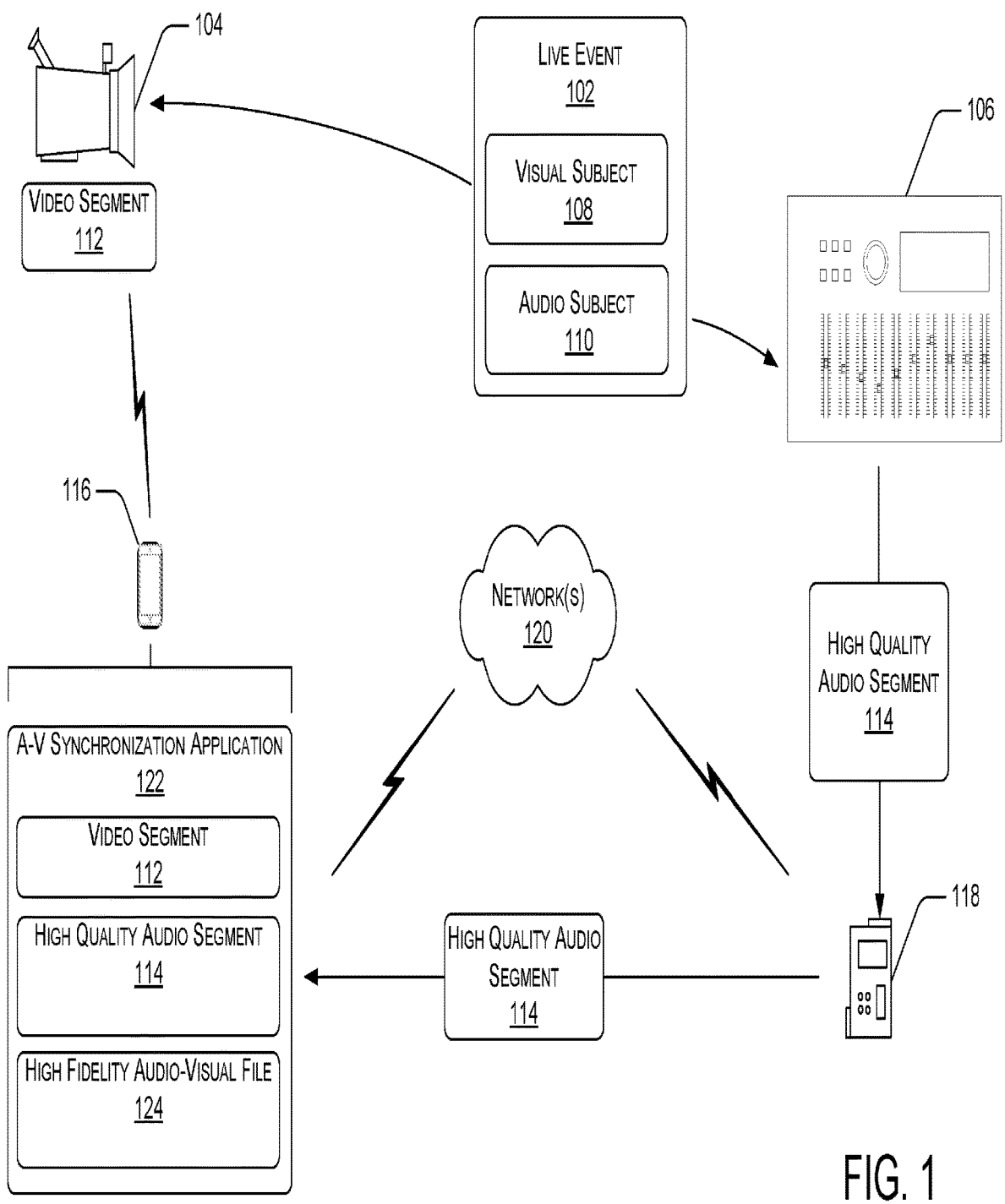
FIG. 1 illustrates a schematic view that shows a filming of a live event by a recording device and sound board equipment, and a transmission of a video segment and high quality audio segment to a reception device.

This disclosure sets forth systems and techniques for temporally synchronizing, in real-time, a high quality audio segment of a live event with a separately recorded video segment of the same live event. In various examples, and without limitation, a live event can include live staged music events, non-amplified events where microphones are in use, stage plays, karaoke, sporting events, live comedic performances, religious events, interviews, live speakers, press conferences, field reporting, film-making, government sessions, and law enforcement recordings where video segments may be temporally synchronized to wearable microphones on an officer's person.

The high quality audio segment may be generated by sound board equipment at the live event and wirelessly transmitted, via broadcasting devices, to reception devices associated with members of the audience. Further, the video segment may be recorded by recording devices associated with members of the audience at the same live event. In some examples, a reception device that receives the high quality audio segment may be the same device as the recording device that generates the video segment. In other examples, the reception device and the recording device may be different devices.

An A-V Synchronization Application may operate on a reception device and temporally synchronize the video segment received from the broadcasting device with the high quality audio segment that is received from the recording device. The A-V Synchronization Application may comprise of a software application executed on one or more computing devices.

The A-V Synchronization Application may generate a high fidelity audio-visual file that combines the video segment with the synchronized high quality audio segment. In some examples, the high fidelity audio-visual file may be transmitted to one or more reception devices at or after a conclusion of a recording of the live event. For example, one or more recordings may be generated during the live event. At a conclusion of each individual recording, the associated high fidelity audio-visual file may be transmitted to one or more reception devices.

This disclosure further describes techniques that temporally synchronize the video segment and high quality audio segment of the live event, in real-time or near real-time. In other words, rather than transmitting a high fidelity audio-visual file at the conclusion of a recording of the live event, the techniques described herein also describe wirelessly streaming a synchronized video segment and high quality audio segment to a reception device during the live event. In some examples, the reception device may be located at the same geographic location as the live event. In other examples, the reception device may be located at different a geographic location to the live event. In the latter example, persons unable to attend the live event may benefit in having a real-time high fidelity digital audio-visual stream of the live event.

The term "recording devices," as used herein, describes any portable electronic device that is capable of generating an audio-visual recording. In some examples, the recording device may be the same device as a reception device, which is described in more detail below. As a non-limiting example, the recording device may include a camcorder, a wearable camera, a smart phone, digital camera, multiple camera arrays for virtual reality (VR), a tablet computer, a media player device, or a laptop computer.

The term "reception devices," as used herein, includes any portable electronic device that is capable of natively executing the A-V Synchronization Application. As described in more detail below, the A-V Synchronization Application facilitates the temporal synchronization of the high quality audio segment that received from the broadcasting device and the separately recorded video segment that is received from the recording device. As a non-limiting example, the reception device may include a smart phone, a tablet computer, a media player device, or a laptop computer. In some examples, the reception device may be the same device as the recording device that generates the video segment of the live event. However, the reception device and the recording device may be separate devices. In some examples, the high quality audio segment may be temporally synchronized to the video segment in real-time and transmitted to a reception device during the live event. In other examples, the high quality audio segment may be temporally synchronized to the video segment at a conclusion of the recording of the live event.

The term "broadcast devices," as used herein, describe the devices at the live event that interface directly with the sound recording equipment used to generate the high quality audio segment. The broadcast devices may transmit the high quality audio segment to one or more reception devices associated with members of the audience at the live event.

The term "high quality audio segment," as used herein, describes a digital audio recording that is produced by sounds engineer(s) and or support staff at a live event, using sound recording equipment and transmitted to reception devices, via broadcasting devices. The sound quality of the "high quality audio segment" is considered to be "high quality" based on an objective comparison to audio segments generated by a recording device at the same live event. Thus, the term "low quality audio segment," as used herein, describes a comparatively inferior audio recording of the same live event that may be produced by a recording device associated with a member of the audience.

In various examples, an objective standard can be applied to illustrate a relative difference in sound quality between a "low quality audio segment" that is recorded by a member of an audience, and a "high quality audio segment" that is produced by sound equipment operator(s). As a non-limiting example, the objective standard can be defined by a signal-to-noise ratio (SNR) of the audio recording; placement of microphone(s) or acoustic pickups relative to the desired sound source being recorded; frequency response of the microphone(s) or acoustic pickups used to produce the high quality audio segment; sensitivity of the microphone(s) or acoustic pickup(s) used to produce the high quality audio segment; exclusion of background noise from the signals being recorded, including crowd noise, echoes and other reflected noise from the sound of the performance; controlled mixing of multiple channels of sound inputs used to produce the high quality audio segment; inclusion of multiple tracks of audio recording in the high quality audio segment to produce stereo and surround sound rather than monophonic sound; and a reduction in wind noise in the high quality audio segment.

The techniques described in this disclosure allow performing artists to better showcase their talents by having a high quality audio segment temporally synchronized to a video segment of a live event. For example, rather than having a distribution of digital audio-visual files with low quality audio segments that detract from an appreciation of a performance, performing artists can have their talents more widely known and appreciated via a distribution of high quality audio segments.

Some performers may agree to make available a high quality audio segment of the live event at no additional cost to audience members while other performers may prefer to charge a fee for providing the high quality audio segment. This disclosure further describes a system for managing the availability of the high quality audio segment based on a performer preference to charge an additional cost.

The term "techniques," for instance, may refer to system(s), method(s), computer-readable instructions, module(s), algorithms, hardware logic, and/or operation(s) as permitted by the context described above and throughout the document.

FIG. 1 illustrates a schematic view that shows a filming of a live event 102 by a recording device 104 and sound board equipment 106, and a transmission of a video segment and high quality audio segment to a reception device 116. In the illustrated example, the live event 102 may comprise of a visual subject 108 and an audio subject 110. For example, the live event 102 may comprise of a live music concert. Accordingly, the visual subject 108 may be the band/orchestra itself, and the audio subject 110 may be the music performed by the band/orchestra. In another example, the live event 102 may comprise of a speech. Accordingly, the visual subject 108 may be the speaker/orator, while the audio subject 110 may comprise of the speech itself. The recording device 104 may generate a video segment 112 of the live event 102 by filming the visual subject 108. Further, the sound board equipment 106 may generate a high quality audio segment 114 of the live event 102 by recording the audio subject 110 of the live event 102 using signals from one or more properly situated microphones and/or acoustic pickup devices. For example, performing artists may be provided with wireless microphones to pick-up airborne sounds, while musical instruments may include acoustic pickups. Acoustic pickups can directly sense acoustic energy from a musical instrument and produce a corresponding analog and/or digital output signal. In some examples, the acoustic pickups may include wireless devices that transmit the analog and/or digital signals to the sound board equipment 106.

The sound board equipment 106 can be used to control the relative levels of acoustic signals received from different acoustic pickups. In other words, the sound board equipment 106 can control the prominence of one acoustic signal over another. In a non-limiting example, the relative level of acoustic signals associated with a vocalist and a guitarist may be adjusted to ensure that the vocalist can be heard over the strums of the guitarist. Further, the sound board equipment 106 may convert various analog input signals to digital signals, thus producing at least one track of a high quality audio segment 114 for the live event 102.

In the illustrated example, the high quality audio segment 114 that is produced by the sound board equipment 106 can be broadcast to a reception device 116, via a broadcasting device 118. The broadcasting device 118 can be configured to wirelessly transmit the high quality audio segment from the sound board equipment 106 to a reception device 116 via one or more networks 120. In some examples, the one or more networks 120 may include local wireless data networks or a personal area network (e.g. Bluetooth or near field communication (NFC) networks). As a non-limiting example, a local wireless data network may also include Wi-Fi, Wi-Fi Peer-to-Peer, and Wi-Fi Direct. Further, one or more networks 120 may include communications established through a Very High Frequency (VHF) transmission band, an Ultra High Frequency (UHF) transmission band, or via a Frequency Modulated (FM) carrier wave.

In the illustrated example, during a performance of the live event 102, and while recording a video segment 112 via a recording device 104, a member of the audience may access an A-V Synchronization Application 122 via the reception device 116. The A-V Synchronization Application 122 may facilitate a real-time or near real-time synchronization of the video segment 112 with the high quality audio segment 114 that is wirelessly received from the broadcasting device 118. In some examples, latency in CPU processor(s) or video/audio signal reception may result in a near real-time synchronization of the video segment 112 with the high quality audio segment 114. In these instances, an additional timing verification may be employed to ensure that a proper synchronization takes place. The timing verification techniques are discussed in more detail below. In some examples, the reception device 116 can be the same device as the recording device 104. In other examples, the reception device 116 can be a different device to the recording device 104. In instances where the reception device 116 and the recording device 104 are different devices, the recording device 104 may establish a communicative connection with the reception device 116 via the one or more networks 120.

The communicative connection may be established through local wireless data networks or a personal area network (e.g. Bluetooth or near field communication (NFC) networks). As a non-limiting example, a local wireless data network may also include Wi-Fi, Wi-Fi Peer-to-Peer, and Wi-Fi Direct. Further, one or more networks 120 may include communications established through a VHF transmission band, a UHF transmission band, or via an FM carrier wave. Further, the communicative connection may be established via wired components, such as an Ethernet port or a Universal Serial Bus (USB).

A high quality camcorder may be selected as recording device 104 to generate a high quality video segment of the live event. In some examples, the high quality camcorder may not have a capability to natively execute the A-V Synchronization Application 122. In this instance, a communicative connection may be established between the recording device 104 and the reception device 116 that is executing the A-V Synchronization Application 122. Doing so allows the A-V Synchronization Application 122 to synchronize a high quality, video segment 112 from a camcorder (i.e. recording device 104) with a high quality audio segment 114 received from the broadcasting device 118 of the live event. Further, at a conclusion of the recording of the live event 102, the A-V Synchronization Application 122 may generate a high fidelity audio-visual file 124 that synchronizes the video segment 112 with the high quality audio segment 114. In some examples, the high fidelity audio-visual file 124 may include one or more tracks. The one or more tracks of the high fidelity audio-visual file 124 are discussed in more detail below, with reference to FIG. 3.

Further, the broadcasting device 118 may comprise of a wireless device/dongle that interfaces with an output jack of the sound board equipment 106. As the event commences, the administrator may turn the broadcast device/dongle on to begin a wireless streaming of the high quality audio segment 114. In other examples, an administrator may activate a broadcast device native to the sound board equipment 106 that causes a wireless streaming of the high quality audio segment 114.

In other examples, a member of the audience may activate the A-V Synchronization Application 122 via a reception device 116. In response, the A-V Synchronization Application 122 may establish a communicative connection with the sound board equipment 106 that requests a broadcast of the high quality audio segment 114. In other examples, a separate output device may be linked to the sound board equipment 106 from which the high quality audio segment 114 may be broadcast.

Figure 2:
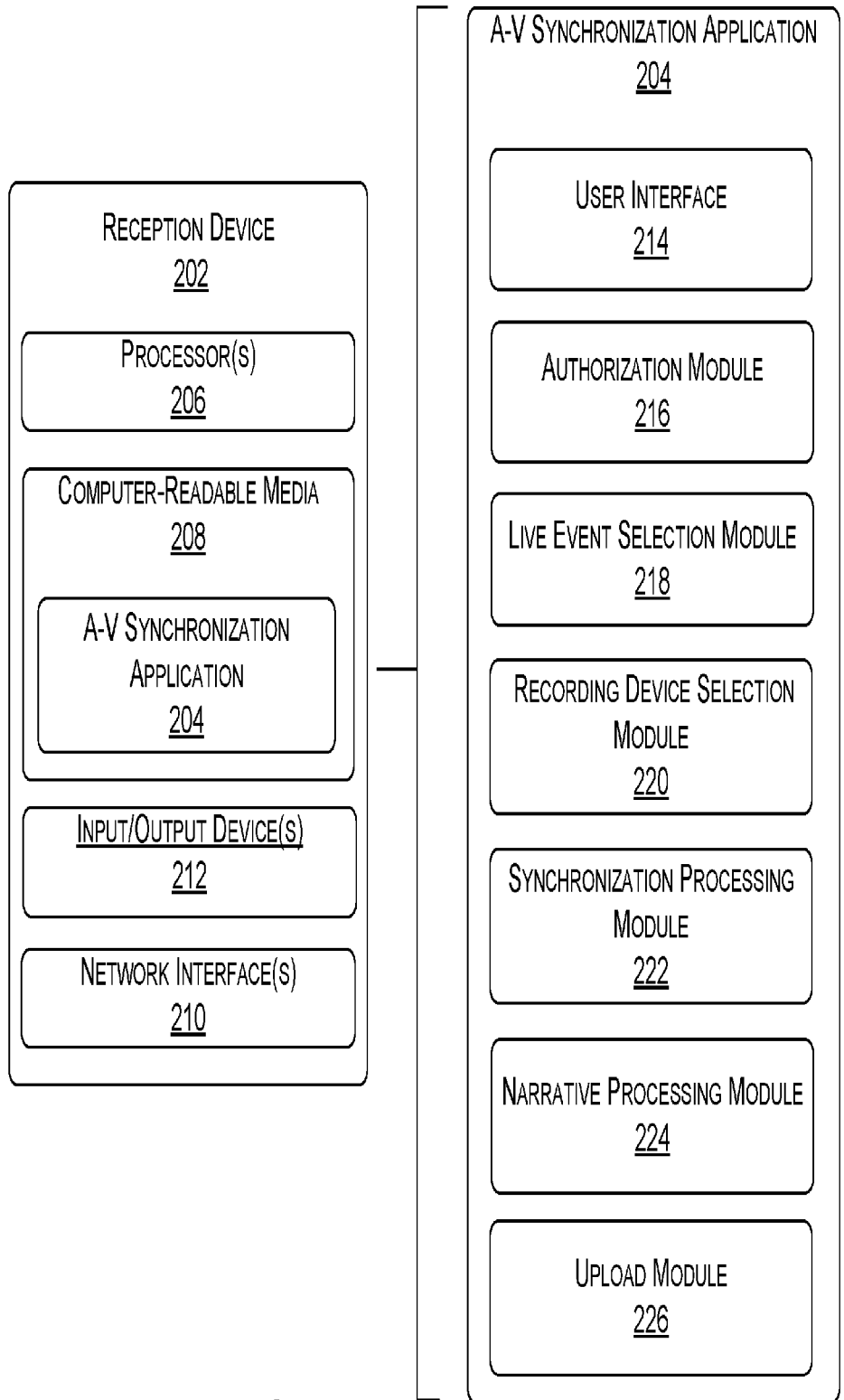
FIG. 2 illustrates a block diagram of a reception device that is capable of natively executing the A-V Synchronization Application.

FIG. 2 illustrates a schematic view of a reception device 202 that is capable of natively executing the A-V Synchronization Application 204. The reception device 202 can correspond to reception device 116. In some examples, the reception device 202 can include one or more processor(s) 206 operably connected to the computer-readable media 208. The reception device 202 can also include network interface(s) 210 that enable communication with other networked devices, such as the sound board at the live event and a separate recording device. For simplicity, other components are omitted from FIG. 2 for clarity.

The computer-readable media 208 may include computer storage media and/or communication media. Computer storage media can include volatile memory (such as RAM), non-volatile memory, non-removable memory, and removable and non-removable computer storage media implemented in any method or technology for storage of information, such as computer-readable instructions, data structures, program modules, or other data. Further, computer storage media includes, but is not limited to, any medium which can be used to store the desired information and which can be accessed by a computing device.

In contrast to computer storage media, communication media embodies computer-readable instructions, data structures, program modules, or other data in a modulated data signal, a carrier wave, or a propagated signal. As defined herein, computer storage media does not include communication media.

In the illustrated example, the computer-readable media 208 may include an A-V Synchronization Application 204. The A-V Synchronization Application 204 may correspond to the A-V Synchronization Application 122. In some examples, the A-V Synchronization Application 204 may facilitate a synchronization of the high quality audio segment that is transmitted by a broadcasting device at a live event, with a separate video segment that is recorded by a recording device associated with an audience member. The functionality and the capabilities of the A-V Synchronization Application 204 is detailed below.

In the illustrated example, the reception device 202 may include one or more input/output device(s) 212. The one or more input/output device(s) 212 may include any type of output device known in the art, such as a display (e.g. a liquid crystal display), speakers, a vibrating mechanism, or a tactile feedback mechanism. Input output device(s) may also include ports for one or more peripheral devices, such as a separate recording device, headphones, peripheral speakers, or a peripheral display. Further, the one or more input/output device(s) 212 can include any type of input device known in the art. For example, input/output device(s) can include a camera, a microphone, a keyboard/keypad, and a touch-sensitive display. A keyboard/keypad may be a push button numerical dialing pad (such as those found on a typical telecommunication device), a multi-key keyboard (such as a conventional QWERTY keyboard), or one or more other types of keys or buttons, and may also include a joystick-like controller and/or designated navigation buttons, or the like.

In the illustrated example, the reception device 202 may include network interface(s) 210. The network interface(s) 210 may include any sort of transceiver known in the art. For example, the network interface(s) 210 may include a radio transceiver that performs the function of transmitting and receiving radio frequency communications via an antenna. As a non-limiting example, the network interface(s) 210 may facilitate communication via a VHF transmission band, a UHF transmission band, or via an FM carrier wave.

Further, the network interface(s) 210 may facilitate wireless connectivity through a telecommunication network, such as a remote telecommunication server. In addition, the network interface(s) 210 may also include a wireless communication transceiver and a near field antenna for communicating over unlicensed wireless Internet Protocol (IP) networks, such as local wireless data networks and personal area networks (e.g. Bluetooth or near field communication (NFC) networks). As a non-limiting example, a local wireless data network may include Wi-Fi, Wi-Fi Peer-to-Peer, and Wi-Fi Direct. Further, the communicative connection may be established via wired components, such as an Ethernet port or a Universal Serial Bus (USB). Further, the network interface(s) 210 may include wired communication components, such as an Ethernet port or a Universal Serial Bus (USB).

The A-V Synchronization Application 204 may operate natively on the reception device 202. In some examples, a user may interact with the A-V Synchronization Application 204, via a user interface 214 presented on a display of the reception device 202. The user interface 214 may optionally provide a plurality of selections that include a user sign-in selection, a live event selection, recording device selection, and an upload selection. In some examples, the user interface 214 may also include an "on/record," an "off/stop" selection, and a "blend" selection. The "on/record" selection and the "off/stop" selection may control when a high quality audio segment received from a broadcasting device is available to synchronize with a video segment recorded by a recording device. In other examples, the "on/record" selection and the "off/stop" selection may control when a recording device films a video segment of the live event. Doing so may also indirectly cause the video segment to synchronize with a high quality audio segment received from a broadcasting device. In some examples, an "on/record" selection may cause an audio input interface of a reception device 202 or a recording device, to automatically disable. This feature ensures that the high quality audio segment that is received from a broadcasting device is not inadvertently polluted by background noise that received via an audio input interface of the reception device 202 or a recording device.

The "blend" selection may be used to activate the audio input interface of the reception device 202 or the recording device, during the live event, and while generating a video segment and receiving a high quality audio segment. In some examples, the "blend" selection may allow an audience member to generate one or more narrative audio segment(s) of the live event. The one or more narrative audio segment(s) may synchronize with the video segment and the high quality audio segment of the live event. A narrative audio segment may include audio received via an audio input interface, such as an internal microphone, of the reception device 202 or a recording device. The one or more narrative audio segment(s) may synchronize with the video segment and the high quality audio segment of the live event. Unlike the high quality audio segment that is received from the broadcasting device, the narrative audio segment may include audio from an audience member describing a live event, or background audio that is in a vicinity of the audience member. The "blend" selection may be used to begin a narrative segment and end the narrative segment.

In the illustrated example, the A-V Synchronization Application 204 may include a plurality of modules that facilitate synchronizing a video segment recorded by the recording device with a high quality audio segment received from a broadcasting device. In the illustrated example, the A-V Synchronization Application 204 may optionally include an authorization module 216, a live event selection module 218, a recording device selection module 220, a synchronization processing module 222, and an upload module 226.

In the illustrated example, the authorization module 216 may optionally provide access to the functionality of the A-V Synchronization Application 204 via a user account. In various examples, access to the user account may require entry of a username and password, or a biometric identifier. In other examples, access may be authorized based at least in part on a geo-location of the reception device. For example, if a geo-location of a reception device is identified as being a known location, the authorization module 216 may provide access to the user account. In a non-limiting example, a known location may include a geo-location frequently visited by a user of the reception device, or a geo-location that is associated with a live event that is registered with the A-V Synchronization Application 204.

Further, the user account may include user profile information, payment information, contact information, and a list of pre-registered authorizations to access high quality audio segments of one or more live events. As a non-limiting example, the pre-registered authorizations may include a password, pass-code, or one-half of a public-private encryption key that is recognized by an administrator of a live event. Accordingly, at a commencement of a live event, the A-V Synchronization Application 204 may wirelessly transmit the pre-registered authorization to an administrator of the live event. In response to verifying a valid pre-registered authorization, the administrator may provide wireless streaming of the high quality audio segment via a broadcasting device.

The user account may access live event authorizations via a remote server that corresponds to a rights-granting host. In this example, an authorization to access a high quality audio segment of a live event may be provided directly from the rights-granting host, rather than as a pre-registered authorization stored within the user account. The profile information, payment information, contact information, and live event authorization information may be manipulated, directly or indirectly, via the user interface 214.

In the illustrated example, the A-V Synchronization Application 204 may include a live event selection module 218. The live event selection module 218 may communicate with the user account of the authorization module 216 to identify a list of live events to which an authorization is available. In some examples, the live event selection module 218 may automatically select a live event, without requiring user actuation, based on a current geo-location of the reception device and an availability of a valid authorization.

Further, the live event selection module 218 may provide a list of live events that may be manipulated via the user interface 214. The list of live events may be populated via event organizer or rights-granting hosts. As a non-limiting example, the list of live events may also be populated by any one of a current geo-location of the reception device, frequently visited locations of the reception device, or profile information within the user account of the authorization module 216.

In some examples, if the live event selection module 218 receives a selection of a live event, via the user interface, the live event selection module 218 may communicate with the authorization module 216 to access an available authorization, or to gain access to an available authorization via a rights-granting host.

In the illustrated example, the A-V Synchronization Application 204 may include a recording device selection module 220. The recording device selection module 220 may automatically select a reception device as the recording device, without requiring user actuation. In other examples, the recording device selection module 220 allow for a selection of a separate recording device. In this example, a user may select an available recording device via the user interface 214 of the A-V Synchronization Application 204. In some examples, a list of available recording devices may be based at least in part on discoverable recording devices. The term "discoverable recording devices" as used herein refers to recording devices that are within a predetermined distance of the reception device that is required to establish a communicative connection. A communicative connection between a reception device and a recording device may be established via local wireless data networks or a personal area network (e.g. Bluetooth or near field communication (NFC) networks). As a non-limiting example, a local wireless data network may also include Wi-Fi, Wi-Fi Peer-to-Peer, and Wi-Fi Direct. Further, one or more networks 120 may include communications established through a VHF transmission band, a UHF transmission band, or via an FM carrier wave. Further, the communicative connection may be established via wired components, such as an Ethernet port or a Universal Serial Bus (USB).

In the illustrated example, the A-V Synchronization Application 204 may include a synchronization processing module 222. The synchronization processing module 222 may be activated, via the "on/record" and "off/stop" selection on the user interface 214. The synchronization processing module 222 may compare characteristics of a video segment being recorded, in real-time or near real-time by a recording device, and the high-quality audio segment that is received via the broadcasting device. Note that even though the video segment and the high quality audio segment are synchronized in real-time during the live event, a timing verification can be performed to ensure that an audio-visual synchronization does not include a timing delay. The timing delay may be due to a time delay in receiving the video segment from the recording device or a time delay in receiving the high quality audio segment from the broadcasting device. Further, latency in CPU processor(s) or video/audio signal reception may result in a near real-time synchronization of the video segment with the high quality audio segment. In these instances, an additional timing verification may be employed to ensure that a proper synchronization takes place. The timing verification techniques are discussed in more detail below.

In various examples, the timing verification techniques may include a comparison of a universal timestamp and local timestamp that is associated with the video segment and/or the high-quality audio segment. In some examples, the synchronization processing module 222 may determine a universal timestamp that corresponds to a point of time at which the video segment and the high-quality audio segment were respectively recorded. Thus a properly timed synchronization includes a timing verification that aligns a universal timestamp of a video segment or audio signal with a respective local timestamp of the same video segment or audio signal. The timing verification is discussed in more detail below.

In a non-limiting example, the timing verification may be based on a universal timestamp and a local timestamp of the video segment. For example, a verified universal timestamp may be associated with a particular video frame of the video segment at a point in time in which the recording device receives a video signal from the live event. The universal timestamp may be based on a Network Time Protocol signal or a Global Positioning System signal.

Further, a local timestamp may be associated with the same particular video frame of the video segment at a point in time in which the particular video frame is received by the reception device 202. Thus, a timing verification for the particular video frame may be based on determining a timing difference between the universal timestamp that is determined at the recording device and the local timestamp that is determined at the reception device 202.

In another non-limiting example, the timing verification may be based on the high quality audio segment. For example, a universal timestamp may be associated with a particular audio signal of the high quality audio segment at a point in time in which a particular audio signal is received by the sound board equipment. Further, a local timestamp may be associated with the same particular audio signal, at a point in time in which the particular audio signal is received by the reception device 202. Thus, a timing verification for the particular audio signal may be based on a determining a timing difference between the universal timestamp that is determined at the sound board equipment and the local timestamp that is determined at the reception device 202. In other examples, the timing verification may be performed by any other method available to one of ordinary skill in the art.

In various examples, a recording device may generate a low quality audio segment in conjunction with the video segment. Accordingly, the synchronization processing module 222 may analyze a waveform associated with the low quality audio segment from the recording device and the high quality audio segment from the broadcasting device. In doing so, a characteristic feature, or fingerprint, of each audio segment may be identified, and a synchronization of the video segment that corresponds to the low quality audio segment and the high quality audio segment can be based at least in part on matching timestamps associated with these characteristic features.

In the illustrated example, the A-V Synchronization Application 204 may include a narrative processing module 224. The narrative processing module 224 may be activated via a "blend" selection on a user interface 214 of the A-V Synchronization Application 204. In some examples, a user may generate one or more narrative audio segments of a live event via an audio input interface associated with a recording device or the reception device 202 itself. The one or more narrative audio segments may vary in length from a few seconds up to a length of the live event itself. In some examples, a first narrative audio segment may comprise of a short introduction to the live event lasting only a few seconds. Further, a second narrative audio segment may be generated at a later stage of the live event, and reflect audio from the audience, at large. The one or more narrative audio segments may synchronize, in real-time, with the video segment and the high quality audio segment. The A-V Synchronization Application 204 may cause the one or more narrative segments to stream, in real-time, with a streaming video segment and high quality audio segment. In other examples, the A-V Synchronization Application 204 may synchronize and record the one or more narrative segments in one or more tracks of the high fidelity audio visual file. The one or more tracks of the high fidelity audio visual file are described in more detail below, with reference to FIG. 3.

In the illustrated example, the A-V Synchronization Application 204 may include an upload module 226. The upload module 226 may be activated, via an "Upload" selection on the user interface 214. In some examples, the upload module 226 may facilitate a real-time audio upload and streaming of the synchronized high quality audio segment to another device/website. In other words, an audience member may stream, in real-time, a personal video of the live event along with a synchronized high quality audio segment during the performance of the live event.

Further, the upload module 226 can facilitate a real-time upload and/or stream of the live event to numerous social media sites, including but not limited to, Facebook®, YouTube®, Instagram®, Twitter®, and other media sites that support live stream video channels, etc. In other examples, the upload module 226 can facilitate real-time streaming of the live event to an additional reception device located at a different geo-location to the live event. In this example, a real-time streaming of the live event is based at least in part on establishing a communicative connection between the reception device used to access the A-V Synchronization Application 204 and the additional reception device. In a non-limiting example, the additional reception device may include a television, a cellular phone, a smart phone, a tablet computer, an electronic book reader device, a media player device, a laptop computer, or any other electronic device that is capable of establishing a communicative connection with the reception device that is located at the live event.

In some examples, the additional reception device may be associated with an internet protocol (IP) address or a universal resource locator (URL). In this example, the IP address or the URL of the additional reception device may be included as a selectable option on the A-V Synchronization Application 204. Therefore, the reception device at the live event may select the IP address or URL of the additional reception device via the user account of the authorization module 216 on the A-V Synchronization Application 204. In doing so, the upload module 226 of the A-V Synchronization Application 204 may communicate with the authorization module 216 to cause a transmission of a real-time stream of the live event to the additional reception device.

Figure 3:
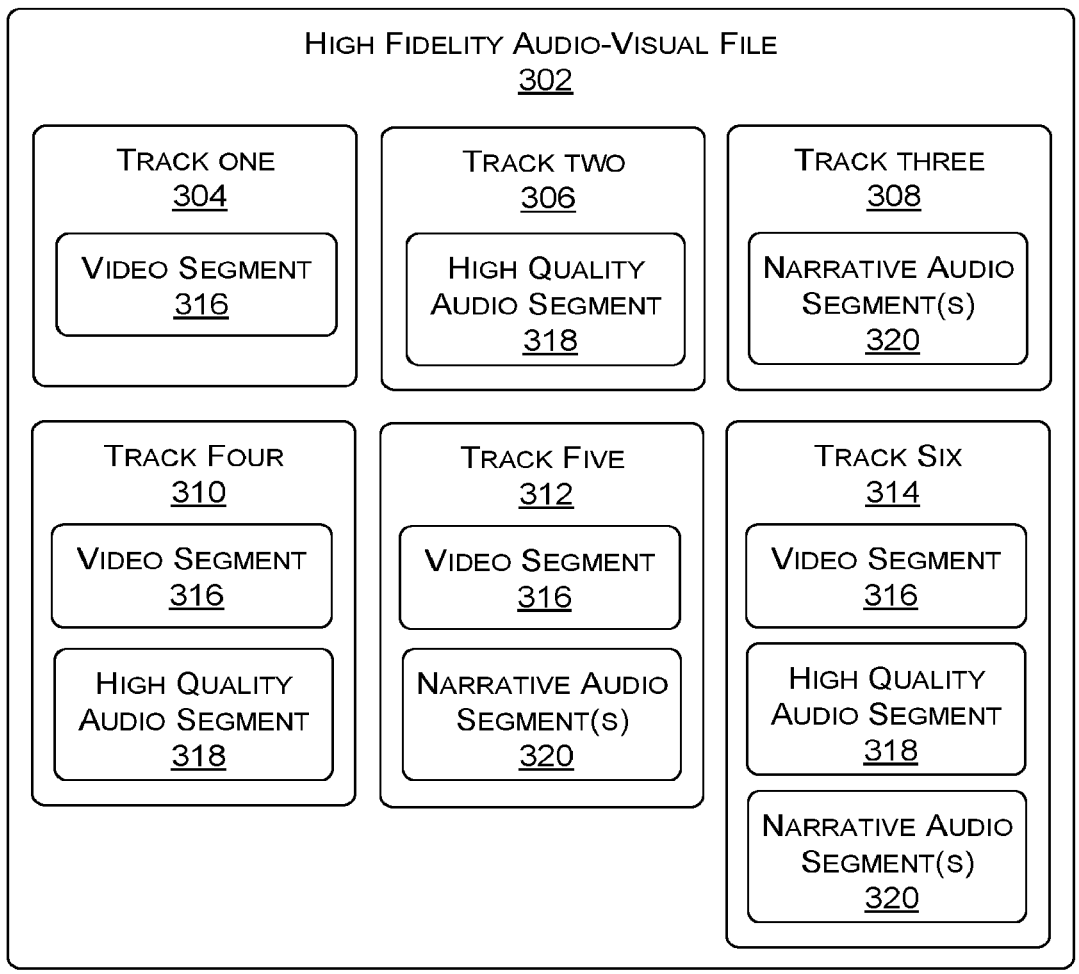
FIG. 3 illustrates a block diagram of a high fidelity audio-visual file that is generated for a live event.

FIG. 3 illustrates a schematic view of a high fidelity audio-visual file. The high fidelity that is generated in real-time, and stored at a conclusion of a recording of a live event. In some examples, a recording may comprise of an entire live event. In other examples, the recording may comprise of only a segment of the live event. In one example, the commencement and conclusion of the recording may be controlled via the "on/record" and "off/stop" selections on the user interface 214 of the A-V Synchronization Application 204. In another example, the commencement and conclusion of the recording may be controlled via the commencement and conclusion of the video recording by the recording device or the reception device 202. In yet another example, the commencement and conclusion of the recording may be controlled by the commencement and cessation of a transmission of a high quality audio segment from a broadcasting device at the live event.

The high fidelity audio-visual file 302 may include one or more audio-visual tracks 304, 306, 308, 310, 312, and 314. In the illustrated example, the high fidelity audio-visual file 302 may include a first track 304 that comprises of the video segment 316 that is recorded by a recording device or a reception device. A second track 306 may include the high quality audio segment 318 that is received from a broadcasting device at the live event. A third track 308 may include one or more narrative audio segment(s) 320 recorded during the live event. Further, a fourth track 310 may include a synchronized combination of a video segment 316 and the high quality audio segment 318 that is received form a broadcasting device at the live event. A fifth track 312 may include a synchronized combination of the video segment 316 and one or more narrative audio segment(s) 320 recorded during the live event. Further, a sixth track 314 may include a synchronized combination of the video segment 316, the high quality audio segment 318, and the one or more narrative audio segment(s) 320 of the live event. A user may directly manage which audio-visual segments to include in an individual audio-visual track of the high fidelity audio-visual file 302, via the user interface of the A-V Synchronization Application. Thus, additional tracks may include any foreseeable combination of the video segment 316, high quality audio segment 318, and one or more narrative audio segment(s) 320.

Figure 4:
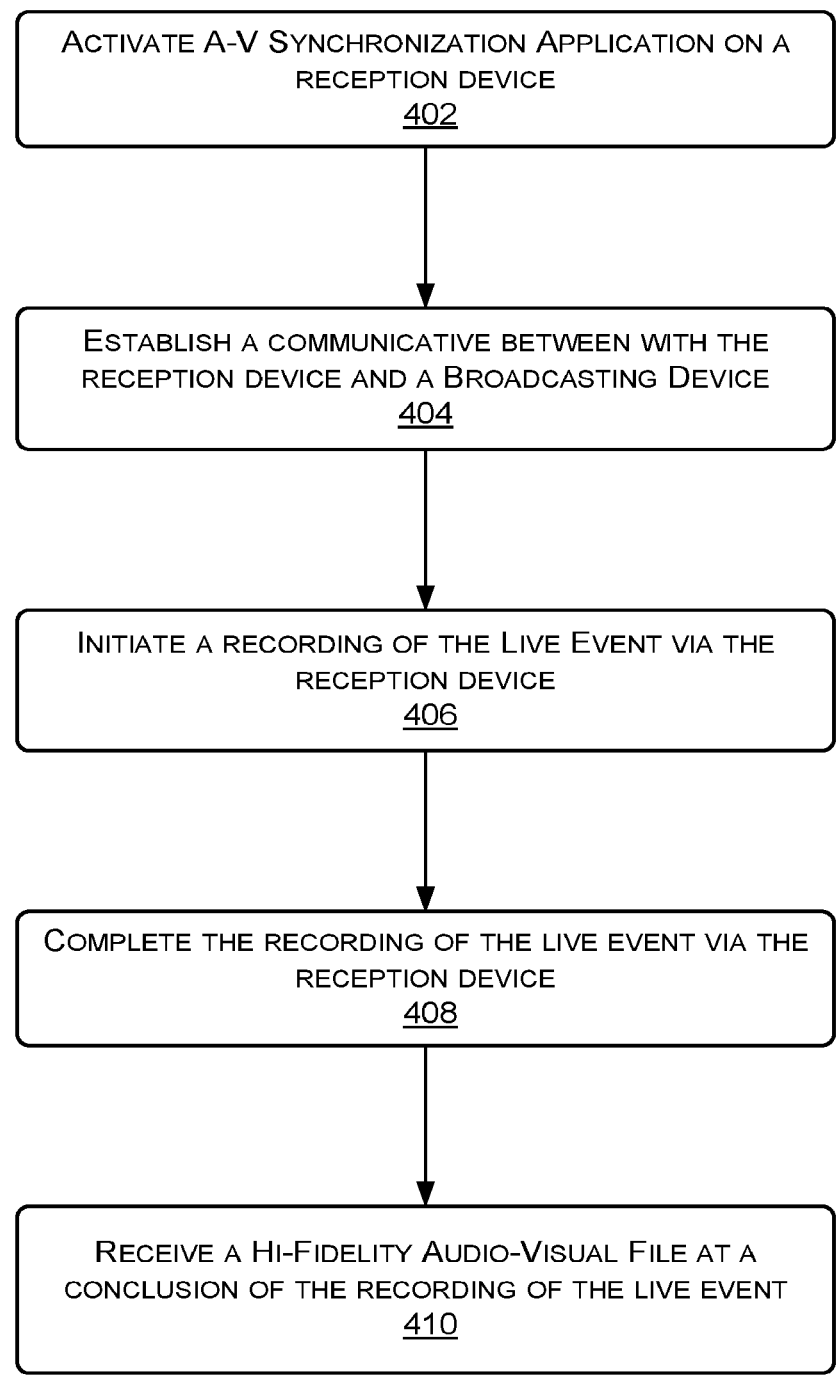
FIG. 4 illustrates a flow diagram of a process to activate the A-V Synchronization Application on a reception device and generate a high fidelity audio-visual file of a live event.

FIG. 4 illustrates a flow diagram of an illustrative process for activating the A-V Synchronization Application on a reception device and generating a high fidelity audio-visual file at a conclusion of a recording of a live event. At 402, the A-V Synchronization Application may be activated on a reception device. In some examples, the A-V Synchronization Application may include pre-registration details for the live event in a user account. Thus, during a live event, the A-V Synchronization Application may wirelessly transmit the pre-registration details to an administrator of the live event for access to the high quality audio segment.

At 404, the A-V Synchronization Application may cause the reception device to establish a communicative connection with a broadcasting device at the live event. In some examples, the broadcasting device may be configured as a "discoverable device" via one or more local wireless networks. In some examples, the one or more local wireless networks may include local wireless data networks or a personal area network (e.g. Bluetooth or near field communication (NFC) networks). As a non-limiting example, a local wireless data network may also include Wi-Fi, Wi-Fi Peer-to-Peer, and Wi-Fi Direct. Further, one or more networks may include communications established through a VHF transmission band, a UHF transmission band, or via an FM carrier wave.

In some examples, establishing a communicative connection between the reception device and the broadcasting device may require a submission and subsequent verification of an authorization. The authorization may include, a password, a pass-code, or one-half of a public-private encryption key that is recognized by an administrator of the live event.

At 406, a video recording of the live event may be initiated via the reception device. The reception device may include a capability of generating a video segment of the live event. Thus, the A-V Synchronization Application may recognize that the reception device has commenced filming of the live event, and in response, begin a synchronization process of the video segment with a high quality audio segment received from the broadcasting device. In other examples, a user selection to commence filming a video segment of the live event may be received via a user interface of the A-V Synchronization Application. In this example, the A-V Synchronization Application may cause the reception device to commence filming of the live event, rather than having the reception device cause the A-V Synchronization Application to commence the synchronization process.

At 408, the video recording of the live event can be completed automatically, or via user actuation. In one example, a user actuation on the reception device may cause the filming of the video segment to end. In this example, the A-V Synchronization Application may subsequently end the synchronization process. In another example, the A-V Synchronization Application may cause the synchronization process to end in response to a lack of signal from the broadcasting device. In this example, a lack of signal may indicate an intermission or an end to the live event.

At 410, a high fidelity audio visual file can be generated and stored on the reception device at a conclusion of the recording of the live event. The high fidelity audio visual file may include one or more tracks that comprise of the video segment, the high quality audio segment, and a synchronized video segment and high quality audio segment. In some examples, one or more high fidelity digital audio visual files may be generated throughout the live event at predetermined time intervals. For example, high fidelity digital audio visual files may be generated at each point in time that a video segment is paused or stopped. Further, in addition to, or alternatively, the high-fidelity audio-visual files may be transmitted to a different electronic device, or website based on an internet protocol (IP) address or a universal resource locator (URL). The high fidelity audio-visual file may be transmitted automatically upon creation, or in response to a user actuation.

Further, techniques to generate and store the high fidelity audio visual file at a conclusion of the recording of the live event may also include incorporating a timing verification to ensure that the video segment and the high quality audio segment are properly synchronized in time. Timing verification may be based on a comparison of a universal timestamp with a local timestamp of a video segment and/or high quality audio segment, or an analysis of a waveform associated with a low quality audio segment relative to the waveform associated with the high quality audio segment.

Figure 5:
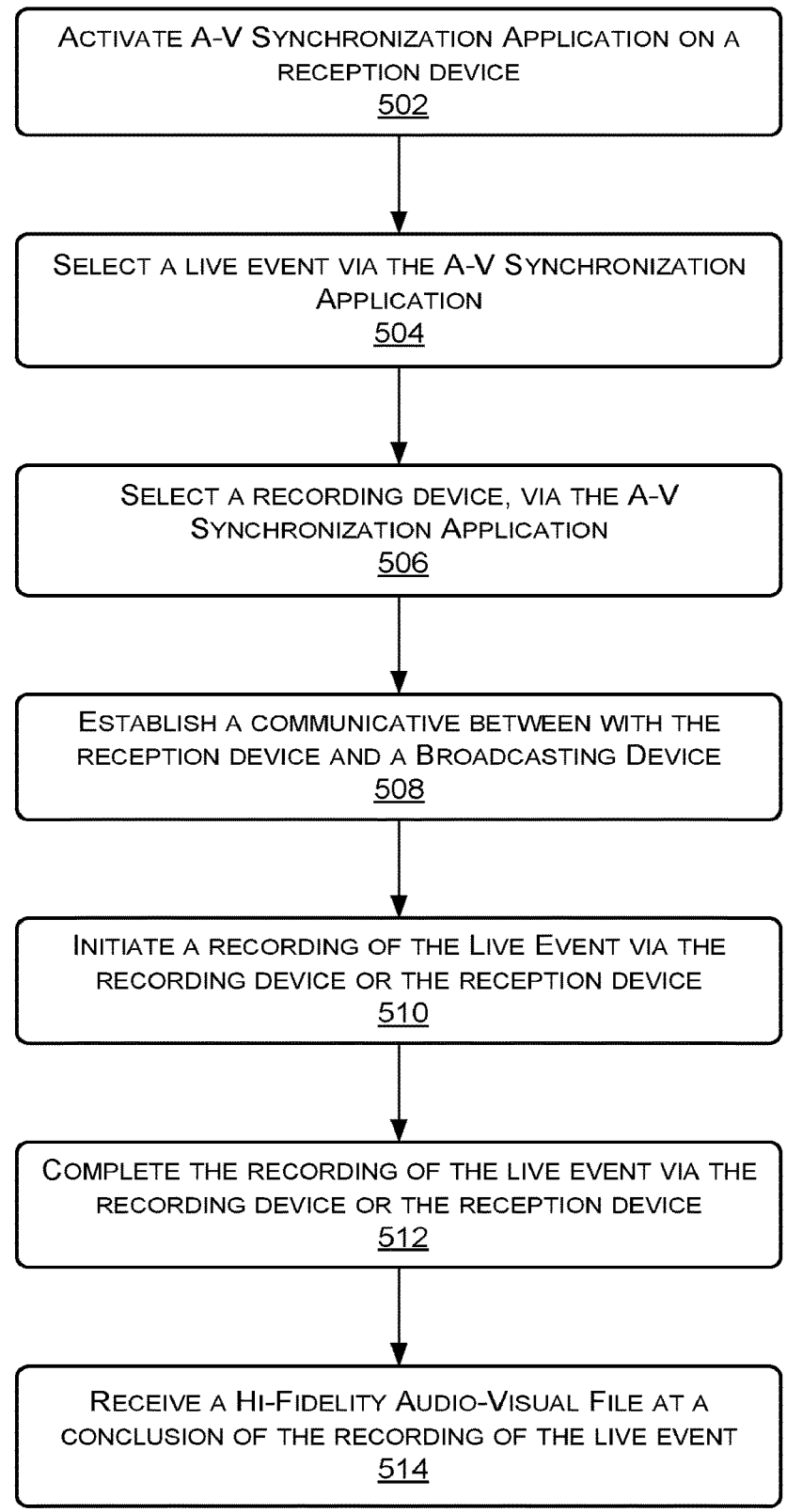
FIG. 5 illustrates a flow diagram of a process to select a live event from the A-V Synchronization Application, and select a recording device that is separate from a reception device

FIG. 5 illustrates a flow diagram of an illustrative process of selecting a live event from the A-V Synchronization Application, and selecting a recording device that is separate from a reception device. In some examples, the A-V Synchronization Application may display, via a user interface, a plurality of live events on a reception device, based on pre-registration details in a user account, or based on a proximity in time and geo-location of the reception device to a live event. Further, the A-V Synchronization Application may display a plurality of recording devices that may be used to record the video segment of the live event. The list of recording devices may be based on "discoverable devices" that the reception device can identify via one or more networks.

At 502, the A-V Synchronization Application may be activated on a reception device. In doing so, the A-V Synchronization Application may present one or more selectable options, via a user interface, to select a live event from a list of live events, and/or to select a recording device from a list of recording devices, to film a video segment of the live event.

At 504, a live event selection may be received via a user interface of the A-V Synchronization Application. The A-V Synchronization Application may determine a list of live events to present based on a reception device being within a predetermined distance of the live event venue. Further, in addition to, or alternatively, the A-V Synchronization Application may only list live events at a point in time that is within a predetermined time interval of a commencement of the live event, and/or during the live event. For example, a live show that commences at a particular location in three hours may be included in the list of live events. However, a live show that commences at the same location, but on the following day, may be excluded from the list of live events.

In some examples, the list of live events may also be based on pre-registration details of live events in a user account that is associated with the A-V Synchronization Application. In this example, the A-V Synchronization Application may wirelessly transmit the pre-registration details to an administrator of the live event for access to the high quality audio segment.

At 506, a recording device selection may be received via a user interface of the A-V Synchronization Application. The A-V Synchronization Application may determine a list of recording devices to present based on "discoverable devices" that are within a proximity of the reception device. The term "discoverable devices" implies devices, to which the reception device may establish a communicative connection, via one more local wireless networks. In some examples, the one or more local wireless networks may include local wireless data networks or a personal area network (e.g. Bluetooth or near field communication (NFC) networks). As a non-limiting example, a local wireless data network may also include Wi-Fi, Wi-Fi Peer-to-Peer, and Wi-Fi Direct. Further, one or more networks may include communications established through a VHF transmission band, a UHF transmission band, or via an FM carrier wave.

At 508, the A-V Synchronization Application may cause the reception device to establish a communicative connection with a broadcasting device at the live event. In some examples, the broadcasting device may be configured as a "discoverable device" via one or more local wireless networks. In other examples, a communicative connection may be established in response to a submission and subsequent verification of authorization information, such as a password, a pass-code, or one-half of a public-private encryption key that is recognized by an administrator of the live event.

At 510, the video recording of the live event may be initiated via the recording device or the reception device. In one example, the A-V Synchronization Application may recognize that the recording device has commenced filming of the live event, and in response, begin a synchronization process of the video segment with a high quality audio segment received from the broadcasting device. In one example, the synchronization process may include a timing verification of the video segment and the high quality audio segment. For example, the timing verification may be based on a comparison of a universal timestamp with a local timestamp of a video segment and/or high quality audio segment, or an analysis of a waveform associated with a low quality audio segment relative to the waveform associated with the high quality audio segment.

In another example, a user selection to commence filming a video segment of the live event may be received via a user interface of the A-V Synchronization Application. In this example, the A-V Synchronization Application may cause the recording device to commence filming of the live event, rather than having the recording device cause the A-V Synchronization Application on the reception device to commence the synchronization process.

At 512, the video recording of the live event can be completed automatically, or via user actuation. In one example, a user action to stop the recording device from filming the live event may cause the A-V Synchronization Application, on the reception device, to end the synchronization process. In another example, a user input, via the user interface of the A-V Synchronization Application, may cause the synchronization process to end. In yet another example, the A-V Synchronization Application may end the synchronization process in response to a lack of signal from the broadcasting device. In this example, a lack of signal may indicate an intermission or an end to the live event.

At 514, a high fidelity audio visual file can be generated and stored on the reception device at a conclusion of the recording of the live event. In some examples, the high fidelity audio-visual file may be transmitted automatically to different electronic devices, or websites based on an IP address or URL information.

Figure 6:
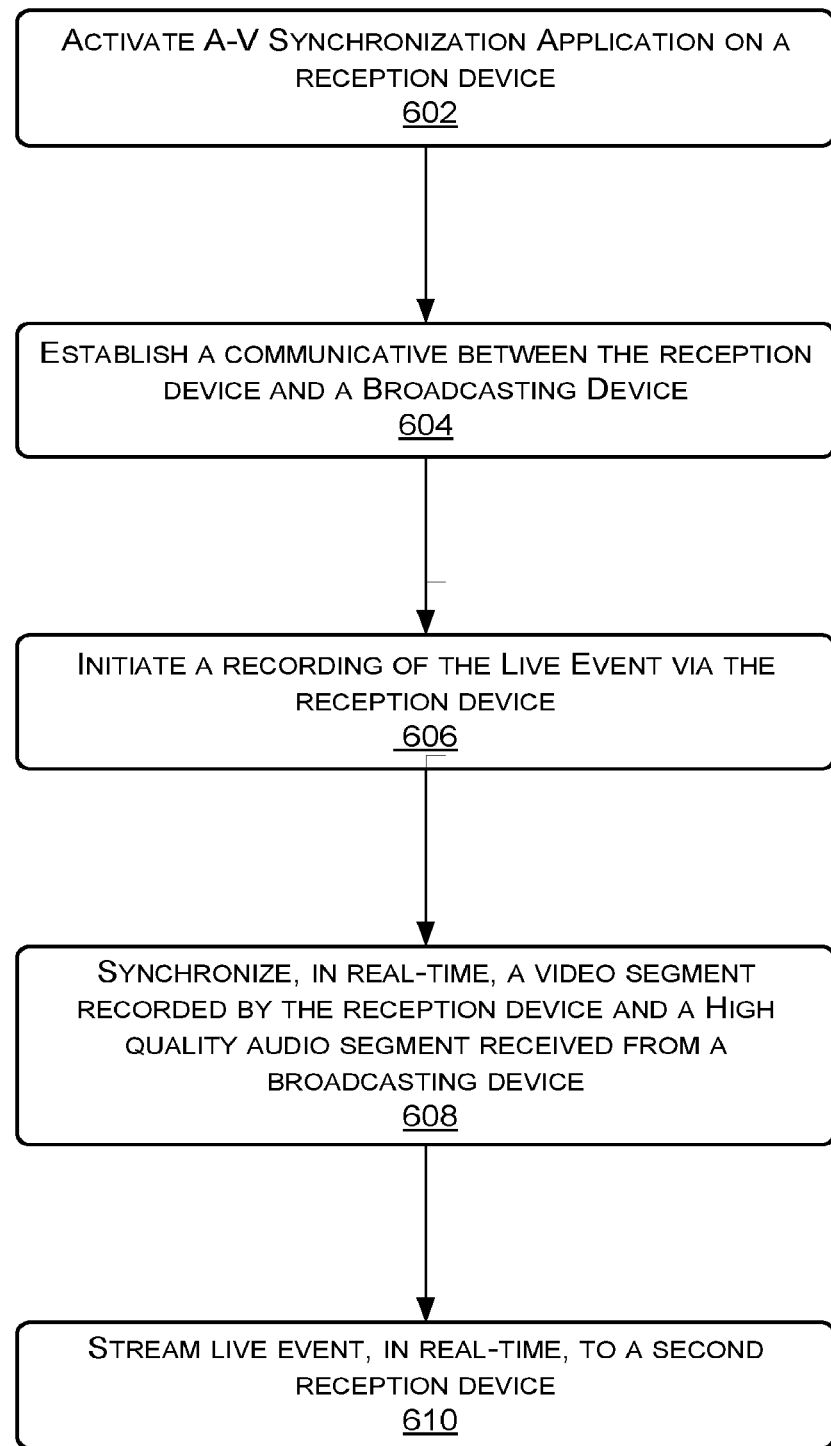
FIG. 6 illustrates a flow diagram of a process to activate the A-V Synchronization Application on a reception device and cause a high fidelity audio-visual recording of the live event to stream, in real time, to a second electronic device at a different geo-location.

FIG. 6 illustrates a flow diagram of a process to activate the A-V Synchronization Application on a reception device and causing a high fidelity audio-visual recording of the live event to stream, in real time, to a second electronic device at a different geo-location. In some examples, the high fidelity audio-visual recording may also stream, in real time, to a website that supports live stream video channels.

At 602, the A-V Synchronization Application may be activated on a reception device. In some examples, the A-V Synchronization Application may present a user interface on the reception device that displays one or more selectable live events. In other examples, the A-V Synchronization Application may automatically assign a live event based on a date and time, and a proximity of the reception device to a geo-location of a live event.

At 604, the A-V Synchronization Application may cause the reception device to establish a communicative connection with a broadcasting device at the live event. In some examples, the broadcasting device may be configured as a "discoverable device" via one or more local wireless networks. In other examples, the broadcasting device may require a submission and subsequent verification of an authorization.

At 606, a video recording of the live event may be initiated via the reception device. The A-V Synchronization Application may begin a synchronization process once video filming of the live event has commenced. In some examples, a video recording of the live event may be initiated and performed by a recording device that is different from the reception device.

At 608, the A-V Synchronization Application may synchronize, in real-time, a video segment recorded by the reception device/recording device with a high quality audio segment that is received from a broadcasting device. Note that even though the video segment and the high quality audio segment are synchronized in real-time during the live event, a timing verification can be performed to prevent a timing delay that may have occurred in receiving the video segment from a recording device or the high quality audio segment from the broadcasting device. Timing verification may be based on a comparison of a universal timestamp with a local timestamp of a video segment and/or high quality audio segment, or an analysis of a waveform associated with a low quality audio segment relative to the waveform associated with the high quality audio segment.

At 610, an audience member may elect to stream the live event in real-time, or near real-time, to an additional electronic device. The additional electronic device may be in a different geo-location or the live event. Alternatively, or additionally, the audience member may elect to stream the live event in real-time, or near real-time to a website that can support live stream video channels. In doing so, the additional electronic device and/or the website may receive, in real-time or near real-time, a high fidelity audio visual steam of the live event. in response to receiving a selection to stream the live event in real-time to an additional electronic device, the A-V Synchronization Application may cause, in real-time, a high fidelity audio visual recording of the live event to stream to the additional electronic device. The A-V Synchronization Application may use information, such as an IP address or a URL, in a user account to establish a communicative connection with the additional electronic device.

Figure 7:
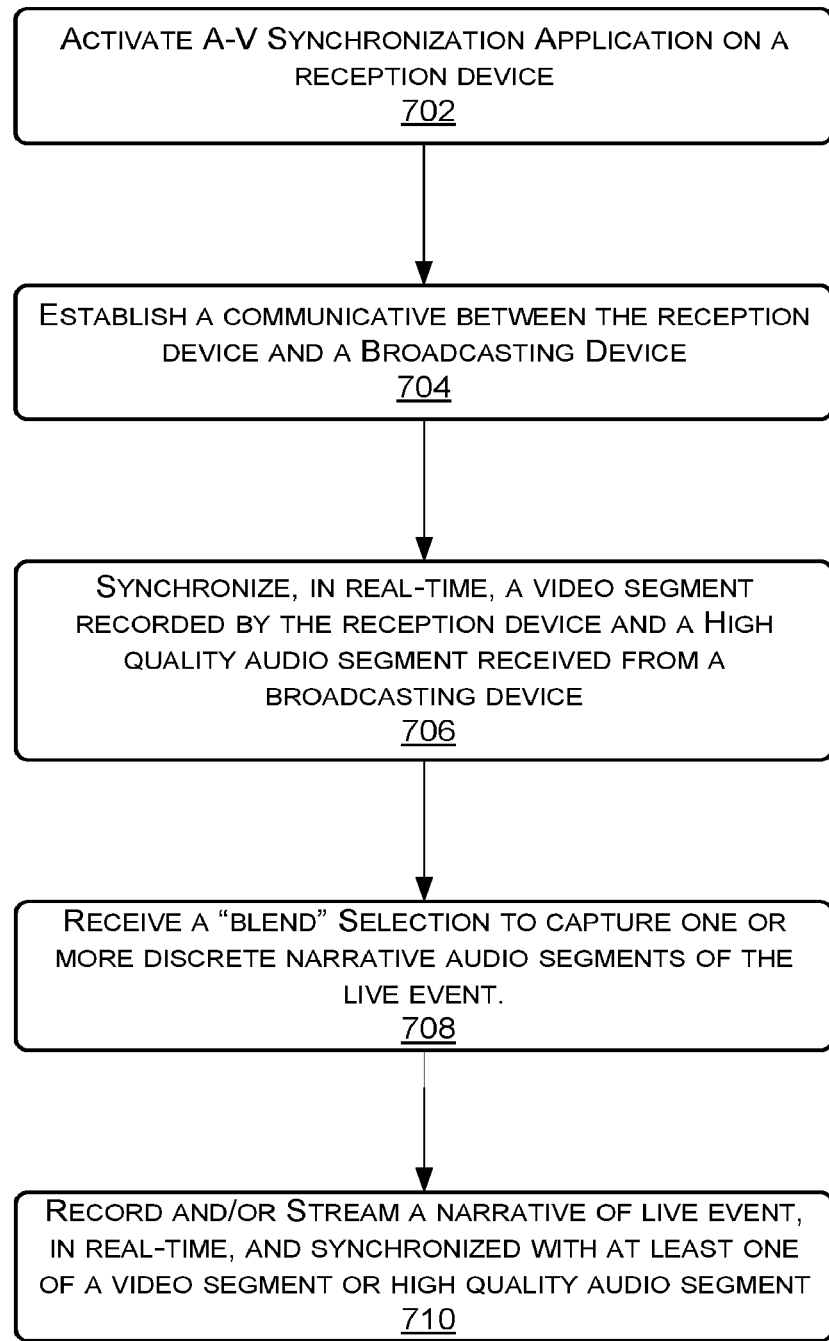
FIG. 7 illustrates a flow diagram of an illustrative process to activate the A-V Synchronization Application on a reception device and cause a narrative audio segment to record and/or stream, in real-time, with at least one of a video segment or a high quality audio segment.

FIG. 7 illustrates a flow diagram of a process to activate the A-V Synchronization Application on a reception device and cause one or more narrative audio segments to record and/or stream, in real-time, with at least one of a video segment or a high quality audio segment. The one or more narrative audio segments may include audio received via an audio input interface, such as an internal microphone, of a reception device or a recording device.

At 702, the A-V Synchronization Application may be activated on a reception device. In some examples, the A-V Synchronization Application may present a user interface on the reception device that displays a "blend" selection to generate one or more discrete narrative audio segments via an audio input interface of a reception device or a recording device.

At 704, the A-V Synchronization Application may cause the reception device to establish a communicative connection with a broadcasting device at the live event. In some examples, the broadcasting device may be configured as a "discoverable device" in an open source environment, such that a reception device may automatically establish a communicative connection without requiring a submission and subsequent verification of an authorization.

At 706, a video recording of the live event may be initiated via the reception device. In some examples, the A-V Synchronization Application may commence a synchronization process once video filming of the live event has commenced. In some examples, a video recording of the live event may be initiated and performed by a recording device that is different from the reception device. In one example, the synchronization process may include a timing verification of the video segment and the high quality audio segment. For example, the timing verification may be based on a comparison of a universal timestamp with a local timestamp of a video segment and/or high quality audio segment, or an analysis of a waveform associated with a low quality audio segment relative to the waveform associated with the high quality audio segment.

At 708, the A-V Synchronization Application may receive a "blend" selection via a user interface associated with the A-V Synchronization Application, on the reception device. The "blend" selection may be used to capture one or more discrete narrative audio segments via an audio input interface of a reception device or a recording device. In the one or more narrative audio segments may vary in length from a few seconds, to several minutes. In some cases, a single narrative audio segment may span the length of the entire live event.

At 710, the A-V Synchronization application may cause, in real-time, or near real-time, the one or more narrative audio segments to synchronize with the video segment and the high quality audio segment to generate a high fidelity audio visual recording of the live event. In some examples, the A-V Synchronization Application may further cause, in real-time, the high fidelity audio visual recording to stream, in real-time, to an additional electronic device. The A-V Synchronization Application may use information, such as an IP address or a URL, in a user account to establish a communicative connection with the additional electronic device. Further, the A-V Synchronization Application may generate a high fidelity audio visual file at a conclusion of the recording of the live event that include the one or more narrative audio segment(s), the video segment, and the high quality audio segment.

CONCLUSION

Although the subject matter has been described in language specific to structural features and/or methodological acts, it is to be understood that the subject matter defined in the appended claims is not necessarily limited to the specific features or acts described. Rather, the specific features are disclosed as illustrated forms of implementing the claims.

What is claimed:

1. A computer-implemented method, comprising:
under control of one or more processors of a hand-held recording device;
establishing a wireless communicative connection between the hand-held recording device and a hand-held audio broadcasting device, the hand-held audio broadcasting device configured to initiate a wireless network and broadcast a high-quality audio stream of a live event over the wireless network;
initiating, on the hand-held recording device and based at least in part on a user selection received via a user interface of the hand-held recording device, a video recording of the live event;
receiving, on the hand-held recording device and via the wireless network, the high-quality audio stream of the live event from the hand-held audio broadcasting device; and
merging, during a time at which the hand-held recording device is capturing at least a portion of the video recording, the video recording of the live event and the high-quality audio stream of the live event to create a merged audio-visual track.

2. The computer-implemented method of claim 1, further comprising:
determining a timing delay in receiving the high-quality audio stream of the live event relative to the video recording of the live event; and
synchronizing the video recording of the live event and the high-quality audio stream based at least in part upon the timing delay.

3. The computer-implemented method of claim 1, wherein the hand-held broadcasting device is a smart phone.

4. The computer-implemented method of claim 1, wherein the hand-held broadcasting device is in communication with a microphone.

5. The computer-implemented method of claim 1, wherein the hand-held broadcasting device is a microphone capable of wirelessly transmitting the high-quality audio stream.

6. The computer-implemented method of claim 1, further comprising receiving a second audio stream of the live event and merging the second audio stream with the high-quality audio stream and the video recording of the live event to create the merged audio-visual track having more than one audio track.

7. The computer-implemented method of claim 6, wherein the second audio stream of the live event is captured by a microphone associated with the hand-held recording device.

8. An electronic device, comprising:
an imaging sensor;
one or more processors; and
memory coupled to the one or more processors, the memory including one or more modules that are executable by the one or more processors to:
cause display of a user interface, the user interface to present a selectable list of local wireless networks, one or more networks of the list of local wireless networks including audio data corresponding to a live event;
receive, via the user interface, a first selection of a network from the selectable list of local wireless networks;
establish a wireless communicative connection between the electronic device and a broadcasting device that is broadcasting audio data associated with the live event over a selected local wireless network;
initiate, using the imaging sensor of the electronic device, a video recording of the selected live event to create a video segment;
receive, from the broadcasting device and over the selected local wireless network, audio data associated with the live event; and
merge, on the electronic device and during a time at which the electronic device is capturing at least a portion of the video recording, the video segment of the selected live event and the audio data of the selected live event to create a merged audio-visual recording.

9. The electronic device of claim 8, wherein the selectable list of local wireless networks includes at least one network broadcast by a hand-held computing device.

10. The electronic device of claim 8, wherein the broadcasting device is a smart phone.

11. The electronic device of claim 8, wherein the memory includes one or more modules that are executable by the one or more processors to perform a timing verification, and based at least in part on the timing verification, synchronize the video segment and the audio data.

12. The electronic device of claim 11, wherein the timing verification is based at least in part on comparing a universal timestamp associated with the broadcasting device with a local timestamp associated with the electronic device.

13. The electronic device of claim 8, further comprising an audio capture device and wherein merging the video segment and the audio data includes merging a second audio stream captured by the audio capture device with the video segment and the audio data.

* * * * *